(12) United States Patent
Torkkeli et al.

(10) Patent No.: US 9,334,160 B2
(45) Date of Patent: May 10, 2016

(54) METHOD OF MANUFACTURING A MEMS STRUCTURE

(71) Applicant: MURATA MANUFACTURING CO., LTD., Kyoto (JP)

(72) Inventors: Altti Torkkeli, Tuusula (FI); Antti Iihola, Helsinki (FI)

(73) Assignee: MURATA MANUFACTURING CO., LTD., Nagaokakyo-Shi (JP)

( * ) Notice: Subject to any disclaimer, the term of this patent is extended or adjusted under 35 U.S.C. 154(b) by 0 days.

(21) Appl. No.: 14/712,987

(22) Filed: May 15, 2015

(65) Prior Publication Data

US 2015/0336793 A1 Nov. 26, 2015

(30) Foreign Application Priority Data

May 20, 2014 (FI) .................................. 20145454

(51) Int. Cl.
*H01L 21/00* (2006.01)
*B81C 1/00* (2006.01)

(52) U.S. Cl.
CPC ......... *B81C 1/00412* (2013.01); *B81C 1/00373* (2013.01); *B81C 1/00396* (2013.01); *B81C 1/00404* (2013.01); *B81C 1/00531* (2013.01); *B81C 1/00611* (2013.01)

(58) Field of Classification Search
CPC .................................. B81C 1/00396
USPC .......................................... 438/50
See application file for complete search history.

(56) References Cited

U.S. PATENT DOCUMENTS

| | | | |
|---|---|---|---|
| 5,045,898 A | 9/1991 | Chen et al. | |
| 5,919,548 A | 7/1999 | Barron et al. | |
| 6,811,853 B1 | 11/2004 | Sherrer et al. | |
| 7,214,559 B2 | 5/2007 | Kim et al. | |
| 7,998,776 B1 | 8/2011 | Li et al. | |
| 8,043,973 B2 | 10/2011 | Goodlin et al. | |
| 8,210,039 B2 | 7/2012 | Rudolf et al. | |
| 8,394,718 B1 | 3/2013 | Gambino et al. | |
| 2001/0050266 A1 | 12/2001 | Sherrer et al. | |
| 2002/0164833 A1* | 11/2002 | Cho ................... | B81C 1/00595 438/50 |
| 2004/0097001 A1* | 5/2004 | Hsieh ................. | B81C 1/00571 438/50 |

(Continued)

OTHER PUBLICATIONS

International Search Report application No. PCT/IB2015/053580 mailed Sep. 2, 2015.

(Continued)

*Primary Examiner* — Matthew Landau
*Assistant Examiner* — Igwe U Anya
(74) *Attorney, Agent, or Firm* — Squire Patton Boggs (US) LLP

(57) ABSTRACT

A method for creating MEMS structures comprises depositing and patterning a first mask on a wafer in order to define desired first areas to be etched in a first trench etching and desired second areas to be etched in a second trench etching. A first intermediate mask is deposited and patterned on top of the first mask. Recession trenches are etched on parts of the wafer. After the first intermediate mask is removed, first trenches are etched with further etching the recession trenches. The first trenches and the recession trenches are filled with a deposit layer. Part of the deposit layer is removed on second areas. A remainder is left on certain areas, to function as a second mask. A third mask is deposited. The third mask defines the final structure. The parts of the wafer on the second areas are etched in the second trench etching. The masks are then removed.

21 Claims, 14 Drawing Sheets

(56) References Cited

U.S. PATENT DOCUMENTS

| | | | |
|---|---|---|---|
| 2004/0232502 A1* | 11/2004 | Hsieh | H02N 1/008 257/415 |
| 2007/0194472 A1* | 8/2007 | Naniwa | B29D 11/00365 264/2.5 |
| 2009/0065928 A1 | 3/2009 | Lutz et al. | |
| 2013/0062713 A1 | 3/2013 | Sakuragi et al. | |
| 2013/0126990 A1 | 5/2013 | Wang | |
| 2015/0091140 A1* | 4/2015 | Wen | B81C 1/00396 257/622 |

OTHER PUBLICATIONS

Search Report dated Jan. 20, 2015, issued in corresponding FI Patent Application No. 20145454.

Office Action dated Oct. 6, 2015 corresponding to related U.S. Appl. No. 14/706,095, filed May 7, 2015.

* cited by examiner

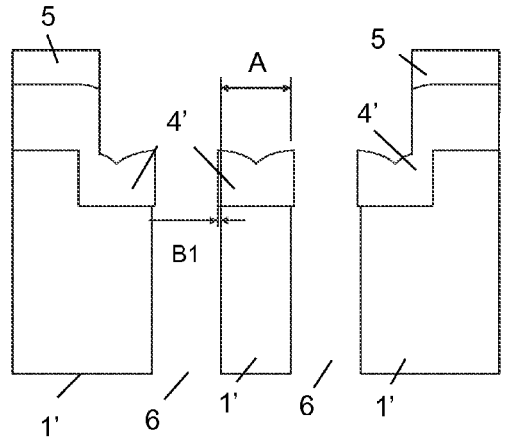
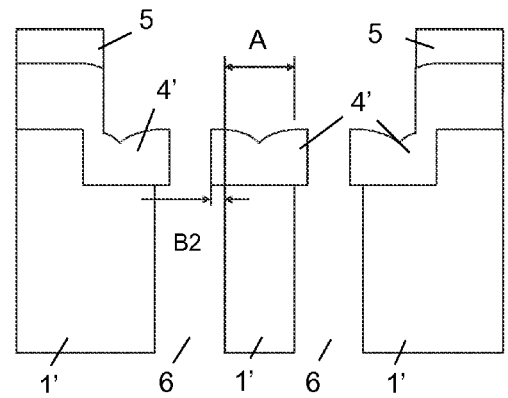
FIG. 2m  FIG. 2n
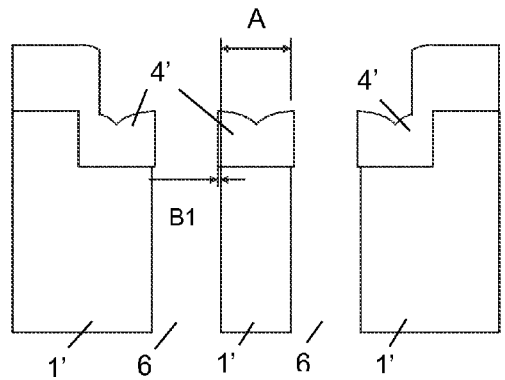
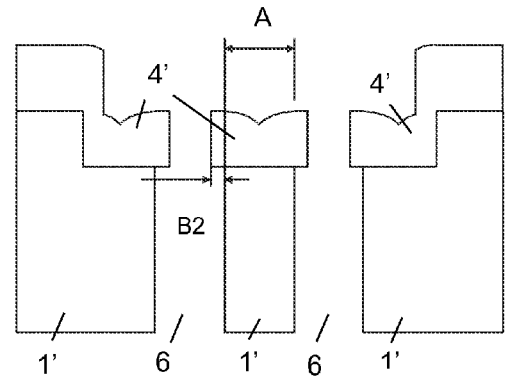
FIG. 2o  FIG. 2p
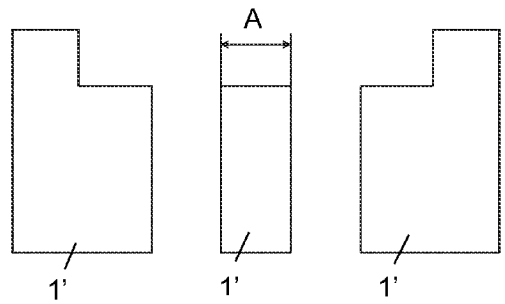
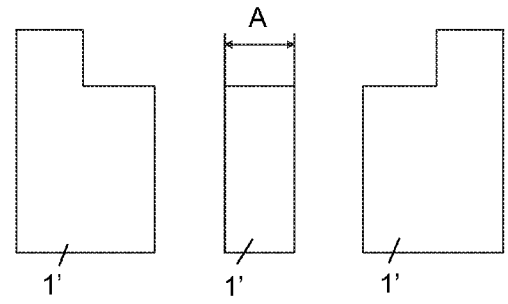
FIG. 2q  FIG. 2r

METHOD OF MANUFACTURING A MEMS STRUCTURE

BACKGROUND

1. Field

The invention is concerned with a method of creating MEMS structures by selectively etching a silicon wafer that is patterned by using a masking layer for defining the structural features of a MEMS device. The invention is also concerned with the use of the method.

2. Description of the Related Art

A micro-electromechanical system (MEMS) device has moving (inertial) elements under control of integrated microelectronics and contains micro-circuitry on a tiny silicon chip into which some mechanical device, such as a microsensor, and/or a microactuator has been manufactured. These microsensors and microactuators constitute the functional elements of MEMS devices. The physical dimensions of MEMS devices can vary from below one micron to several millimeters.

MEMS devices convert a measured mechanical signal into an electrical signal. MEMS sensors measure the mechanical phenomenon and the electronics then process the information derived from the MEMS sensors and through some decision making capability direct the actuators to respond by e.g. moving, positioning, or regulating in order to thereby control the environment for some desired outcome or purpose. MEMS devices can thus comprise both drive elements and sensing elements to perform specific functions.

Examples of systems fabricated using MEMS technology are pressure sensors, accelerometers for measuring acceleration of moving objects and gyroscopes for measuring angular velocity of rotating objects.

MEMS devices may be capacitive or they may make use of piezoelectric transduction.

A key element in a capacitive MEMS device is a variable capacitor formed between a stationary electrode and a movable electrode attached to a flexibly suspended proof mass. The movable electrode deflects in response to acceleration in an accelerometer or Coriolis force exerted on the proof mass when an angular velocity is applied to a gyroscope and used for measuring this angular velocity. The amount of deflection can be sensed from changes in capacitance caused by the changes in the gap between the two electrodes due to deflection.

Accelerometers are acceleration sensors. An inertial mass suspended by springs is acted upon by acceleration forces that cause the mass to be deflected from its initial position. This deflection is converted to an electrical signal, which appears at the sensor output. The application of MEMS technology to accelerometers is a relatively new development.

An accelerometer comprises a proof mass, one side of which is fixed to a carrier while the other is flexibly suspended by a membrane or a cantilever beam, for example. The accelerometer further comprises means for detecting the movement of the proof mass caused by the effect of acceleration. This constitutes a sensor, which senses acceleration force.

Inertial sensors are a type of accelerometer and are one of the principal commercial products that utilize surface micromachining.

When things rotate around an axis they have angular velocity. Gyroscopes, or gyros, are devices that measure or maintain rotational motion. In MEMS devices, vibration is typically used as primary motion of the gyroscope rather than rotation. In a vibrating sensor of angular velocity, i.e. a gyroscope, a certain known primary or seed motion is induced and maintained in the sensor. The desired motion to be measured by means of the sensor is then detected as a deviation of the primary motion.

When MEMS technology is implemented as gyroscopes, these have a structure suspended above a substrate and associated electronics that causes the primary motion, senses movement of the suspended structure and deliver the sensed movement to an external computer. The computer processes the sensed data to calculate the property being measured. In some embodiments, the substrate may be formed by a silicon wafer called the handle wafer on which the device wafer is attached to.

Structures for vibrating gyroscopes are formed, for example, by etching a semiconductor wafer to form a proof mass used as a reference in the measurement. The proof mass is suspended by a spring system, such as elastic beams, to a substrate that may be considered as a fixed structure in relation to the proof mass. An electronic drive circuit which may be on the same substrate applies an alternating drive current to driving electrodes which vibrate the proof mass in a drive direction. The electrical drive mechanism vibrates the proof mass along a drive axis and the electrodes build a capacitance together with the proof mass for detecting movement of the proof mass along a sense axis perpendicular to the drive axis. A triple axis MEMS gyroscope, can measure rotation around three x, y, and z axes, while single and dual axis gyros measure the rotation around one or two of these axis correspondingly.

The electrodes detect displacements of the proof mass in a sensing direction orthogonal to the drive direction. The vibrating gyroscope thus rely on the vibration of this proof mass in one direction as the primary motion and in detecting the movement caused by Coriolis force, generated in the perpendicular direction by the rotational speed. Conversion of rotation to Coriolis force is the basis of the operation of a gyroscope.

The production process and the technology used for producing the structures with the springs and the beams in MEMS based gyroscopes often lead to quadrature errors, such as errors caused by driving the vibrating proof mass along a direction which is not exactly perpendicular to the direction along which the Coriolis movement is measured. The component of the vibrating drive movement in the sense direction generates an output signal caused by the Coriolis force.

One of the most significant problems in micromechanical vibrating sensors of angular velocity is the so called quadrature signal, which is caused by poor dimensional precision in the structures. The quadrature output signal is in phase with the drive signal used for driving the proof mass, while the component for this output signal due to the Coriolis force is shifted by 90 degrees.

In the sensor, the quadrature signal can be compensated for by using electric forces, such as e.g. feedback compensation, feed-forward compensation, or other electrical compensation.

Compensation by means of electric forces, however, constitutes a challenge to the sensor's electronics requiring either accurate phase control or, possibly, large voltages and separate structures within the sensor.

These miniaturized sensors, actuators, and structures can all be merged onto a common silicon substrate or on separate silicon substrates along with integrated circuits (microelectronics). While the electronics are fabricated using integrated circuit (IC) process sequences, the micromechanical components are fabricated using micromachining processes that selectively etch away parts of a silicon semiconductor wafer or add new structural layers to form the mechanical and electromechanical devices. The wafer is patterned and etched to define the structural features of the sensor in the semiconductor layer. The wafer serves as the substrate for the microelectronic devices built in and over the wafer and, in addition to patterning and etching, undergoes many other microfabrication process steps, such as doping or ion implantation, and deposition of various materials. Finally the individual microcircuits are separated into dies and packaged.

Die refers to one small block of the semiconducting material, on which a given functional circuit, a chip, is fabricated. In the manufacturing of the micro-electronic devices, each individual die contains one of the integrated circuits. During manufacturing, a wafer with up to thousands of circuits is cut into rectangular pieces, each called a die. The integrated circuits are produced in large batches on a single wafer.

Device wafer refers to the semiconductor wafer that is used for manufacturing the functional, inertial parts of a MEMS device. Device wafer may further include at least some electrical parts of the MEMS device.

Etching is a critically important process module, and every wafer undergoes many etching steps before it is complete. For many etch steps, part of the wafer is protected from the etchant by a "masking" material which resists etching. The masking material is e.g. a photoresist which has been patterned using photolithography. The patterning shows which parts of the wafer should be etched.

In anisotropic etching, the etching rate is different in horizontal and vertical direction. Bias refers to the difference in lateral dimensions between the feature on mask and the actually etched pattern caused by undercut, which refers to a portion that is etched away under the mask.

The profile of the etched structures has a big impact on the performance of the MEMS device. A typical non-ideality in especially Deep Reactive Ion Etched (DRIE) structures causing problems is that some etches undercut the masking layer and form trenches with sloping sidewalls. The distance of undercutting is called bias. The undercut problem is even more difficult to solve if its extent varies within the structure or within the area of the semiconductor wafer.

Undercut can be defined as the difference between the mask intended to define the etching boundaries and the actual etched dimensions.

Usually, the undercut is compensated by using mask bias, which means making the mask dimensions larger than the intended trench dimension to compensate for the undercut. However, the biasing of the mask does not provide a complete solution because the DRIE undercut varies across the wafer. This is because there is a radial distribution coming from the geometry of the DRIE tool. Furthermore, some MEMS devices, like z-axis gyroscopes, are more critical to dimension accuracy within one die than to die-to die variations. This is because beam variation within one die causes the primary motion to differ from the designed direction resulting in the so called quadrature signal. The quadrature signal of a z-axis gyroscope is highest in such a wafer area where the dimension change rate, as a function of position, is highest.

An attempt to provide a structure of a vibrating sensor of angular velocity, in which the compensation for the quadrature signal is implemented directly by mechanical design, without electric forces is disclosed in U.S. Pat. No. 8,210,039.

U.S. Pat. No. 8,043,973 discloses a method for mask overhang reduction by a process design comprising the use of two masking layers to reduce lateral substrate undercut.

U.S. Pat. No. 7,214,559 discloses a method for fabricating a vertical offset structure by using several etching steps.

SUMMARY

An object of this invention is to provide a structure for compensation for the quadrature signal with improved methods by eliminating non-uniformities within the wafer.

The method may further be applied to generate recessed structures. With recessed we refer to a structure having its top surface below the top face of the other parts of the sensor device layer forming the functional (inertial) elements of the MEMS device. Recessed structure is beneficial for many functional elements and structures of a MEMS device. In comb structures, recession allows controlling of the change of capacitance between the two comb electrodes also in vertical motion. Flexibility of spring structures may be adjusted by making the springs thinner and thus more flexible by recessing the top face of the spring.

Generation of recessed structures may cause problems in a MEMS manufacturing process using an anisotropic etching process such as DRIE. Recessing a semiconductor wafer face having trenches of varying depth by DRIE etching may cause silicon spiking at the edges of the recessed structures. That is, when the surface has steps of varying depth the conditions for a micromasking phenomenon are more favorable. On the DRIE silicon etching process, after each silicon etching substep polymer passivation is incompletely removed from the very edges of recessed areas. Polymer starts to act as a mask generating thin and tall silicon spikes. Applying embodiments of the invention enables providing a recessed structures with eliminated non-uniformities, no spiking of the edges of the recessed structures while effectively maintaining the capability for compensating of quadrature signals.

A method is presented for creating MEMS structures by selectively etching a silicon wafer that is patterned by using masking layers for defining the structural features of a MEMS device. The method comprises depositing and patterning a first mask on a silicon wafer in order to define desired first areas on the wafer to be etched in a first trench etching and to define desired second areas to be etched in a second trench etching. A first intermediate mask is deposited and patterned on top of the first mask, the first intermediate mask defining desired areas on the wafer to be recessed by etching to a first defined depth. Recession trenches are etched on the parts of the wafer not covered by the first intermediate mask nor the first mask in a recession trench etching, and said first intermediate mask is removed. First trenches are etched together with further etching the recession trenches on the parts of the wafer not covered by the first mask in a first trench etching. The first trenches and the recession trenches are filled with a deposit layer. A part of the deposit layer is removed on the desired second areas to be etched in the second trench etching and leaving the rest of it on areas other than the second areas to function as a second mask in order to define final structures, and parts of the wafer on the desired second areas are etched in the second trench etching. Said second mask is removed.

In certain embodiments, the method may further comprise depositing a third mask after filling the first trenches and the recession trenches to protect the deposit layer on areas defining the final structures and removing it together with the second mask.

Embodiments of the method may further comprise depositing a third mask after removing a part of the deposit layer on the desired second areas, to protect the deposit layer on areas defining the final structure and removing it together with the second mask.

The method can also further comprise using a photoresist as the first and/or second and/or third mask and and/or the first intermediate mask material and using photolithography as a mask patterning method.

In some embodiments, the method comprises using silicon dioxide or metal as the first and/or second and/or third mask and/or the first intermediate mask material, and/or an anisotropic etching process, such as Deep Reactive Ion Etching, DRIE, as an etching method.

The recession trench etching results in recession trenches having a depth of 0.5-5 μm, and the first trench etching result in shallow first trenches having a depth of 0.4-5 μm.

The second trench etching results in second trenches having a depth of 2-100 μm, wherein said second trenches may extend through the device wafer.

Removing the first and/or second and/or third mask and/or first intermediate mask by a liquid resist stripper or plasma ashing.

The method can also further comprise using a dielectric material, such as Tetraethyl Orthosilicate (TEOS), or a metal as the deposit material layer.

The method may also, in some embodiments, comprise using chemical vapor deposition, CVD, for depositing the deposit layer.

The method may also comprise using metal as the deposit material layer, whereby Physical Vapor Deposition, PVD, electro-deposition, or electroless deposition, is used for depositing the deposit layer.

The method can also further comprise removing the part of the deposit layer chemically by an etch-back procedure.

Additionally, some embodiments of the method further comprises removing the part of the deposit layer by Chemical-Mechanical Planarization, CMP.

The method as described may be used for manufacturing a gyroscope by dimensioning the structures suitable for a gyroscope, and/or it may be used for manufacturing an accelerometer by dimensioning the structures suitable for an accelerometer.

In one embodiment, the first mask is removed after the first trench etching or it can be removed together with a part of the second mask when that is removed.

The third mask can either be deposited after having filled the first trenches with a deposit layer and be removed together with the second mask or alternatively, the third mask can be deposited after the removing of a part of the deposit layer.

A photoresist can be used as the first and/or second and/or third mask material, whereby photolithography is used as the mask patterning method. Silicon dioxide or metal can also be used as the first and/or second and/or third mask material. The first and/or second and/or third mask is remove by a liquid resist stripper or plasma ashing.

An anisotropic etching process, such as Deep Reactive Ion Etching, DRIE, can be used for the etching steps. When no recessed structures are etched the first trench etching results in shallow trenches of 0.4-5 μm and the second trench etching in trenches of the depth of 2-100 μm. A recession trench etching may be performed before the first trench etching, allowing generation of recessed structures. The recession trench etching may result in shallow trenches of 0.5-5 μm. The recession trenches created during the recession trench etching will consequently be further etched during the first trench etching, so that the depth of the recession trenches will total the sum of depths of the recession trench etching and the first etching.

A dielectric material, such as silicon dioxide, $SiO_2$, can be used as the deposit material layer. In that case, it is preferable to use chemical vapor deposition, CVD, for depositing the deposit layer. When metal is used as the deposit material layer (4), a preferable deposition method for depositing the deposit layer is Physical Vapor Deposition, PVD, electro-deposition, or electroless deposition.

Depending on embodiment, the part of the deposit layer is either chemically removed by an etch-back procedure or by Chemical-Mechanical Planarization, CMP.

The inventive idea provides compensating of wafer-level non-uniformity of undercut by using etching for both the mask and the structure in a way that undercut becomes cancelled, which is achieved by the method of the invention.

In the invention it has been concluded that the beam dimension variation within one die origins from the radial wafer distribution of the etch profile. Z-axis gyroscopes are most sensitive to this error.

Next, the invention is described more in detail by referring to some preferable embodiments and by referring to figures. The invention is not restricted to the details of these embodiments.

DETAILED DESCRIPTION

Figure 1A:
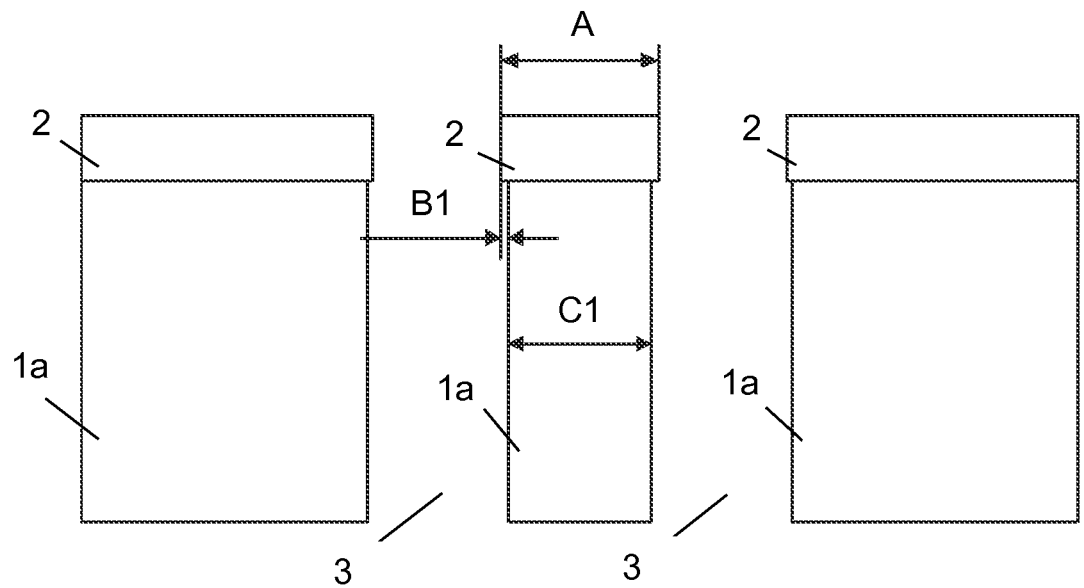
FIGS. 1a and 1b are simplified presentations of non-uniformity as a phenomenon in a DRIE-etched structure causing dimension variations.
Figure 1B:
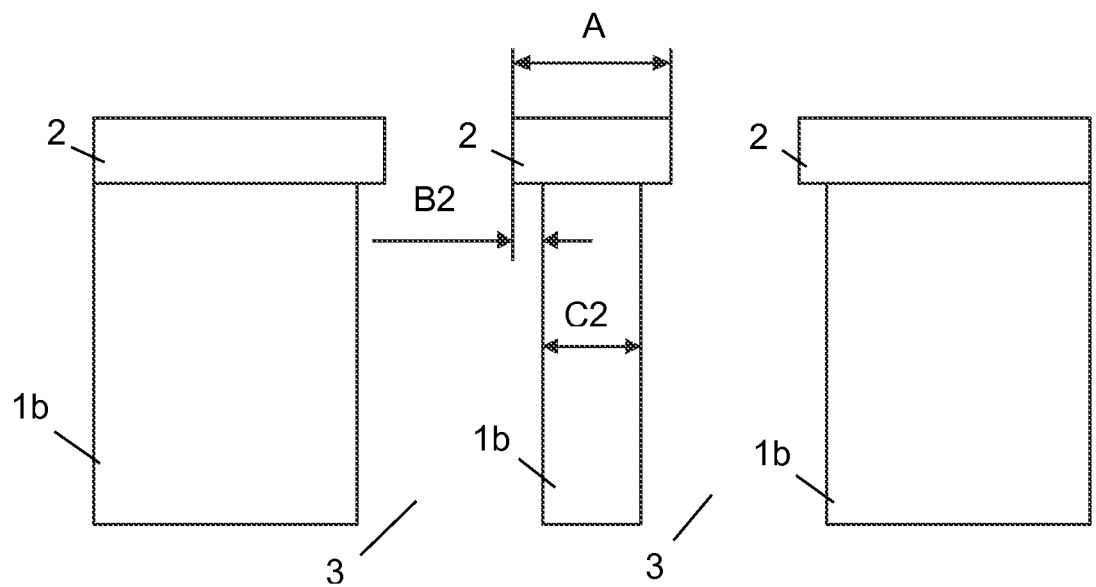

FIGS. 1a and 1b are simplified presentations of non-uniformity in undercut in general in a DRIE-etched structure causing dimension variations in a MEMS structure.

Parts of a top layer silicon wafer have been DRIE-etched on exposed surfaces not covered by a masking layer 2 to form structures 1a and 1b in the device wafer. FIGS. 1a and 1b only show the structures 1a and 1b of the device wafer until the depth of the etching, and therefore the formed trenches 3 can be seen as spaces only. FIGS. 3-5 present how the device wafer 1 is in reality bond to a handle wafer 11 with an air cavity 9 for the functional structures being formed from parts of the device wafer 1. Hereafter, the device wafer 1 is called wafer 1.

FIG. 1a shows the structures 1a of a device wafer close to the center of the wafer, whereas FIG. 1b shows the structures 1b of the device wafer 1 at or close to the wafer edge. A mask 2 is placed on the wafer top face.

In FIGS. 1a and 1b, A is a horizontal dimension of the mask 2 on the actual covered parts of the wafer 1, while dimensions C1 and C2 are the horizontal dimensions of structures formed from the device wafer and dimensions B1 and B2 are the distances of the undercut defined as the difference between A and C1/C2, which is the dimension of the portion that is etched away unintentionally under the mask. The whole undercut is defined by 2×B1 or 2×B2, since B1/B2 is the distance of undercut only on one side. Ideally, A should correspond to C1/C2, but the undercut causes the difference B1/B2.

Undercut can be defined as the difference between the mask dimension A intended to define the etching boundaries and the actual etched dimensions. The distance of undercutting is called bias and its extent in the structures varies within the wafer 1. Thus, the etching process causes a larger undercut B2 at or near the wafer edge than in the wafer center, wherein the undercut B1 is smaller. Therefore the structure dimension C2 is smaller at the wafer edge than the structure dimension C1 in the center of the wafer 1, if the used mask dimension A is equal in both cases.

In reality, the trenches under the mask may have sloping and/or uneven sidewalls since the undercut tends to be less immediately under the mask as compared to more undercut further down from the mask. For simplification, the trenches 3 are, however, presented with straight sidewalls in FIGS. 1a and 1b.

Figure 2A:
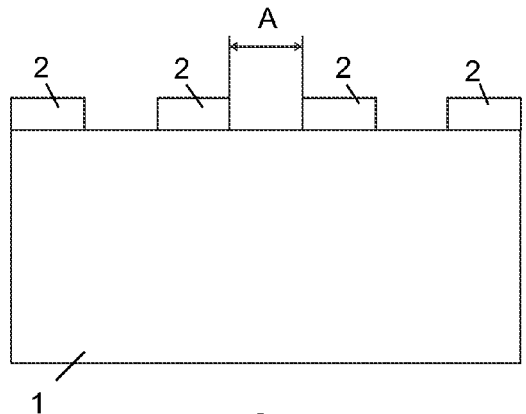
FIGS. 2a-2r illustrates the method of the invention principally to compensate for non-uniformities on wafer level.

FIGS. 2a-2r principally illustrate successively the method of the invention step by step that compensates for non-uniformities on wafer level. FIGS. 2a, 2c, 2e, 2g, 2i, 2k, 2m, 2o and 2q successively illustrates the method at a part of the wafer that is at the center of the wafer, whereas FIGS. 2b, 2d, 2f, 2h, 2j, 2l, 2n, 2p and 2r illustrates the method successively for a part of the wafer that is at or near the wafer edge.

As was the case with FIGS. 1a and 1b, FIGS. 2a to 2r only show the device wafer 1, which in reality is bond to a handle wafer with an air cavity for the functional structures, as presented in FIGS. 3 to 5.

Figure 2B:
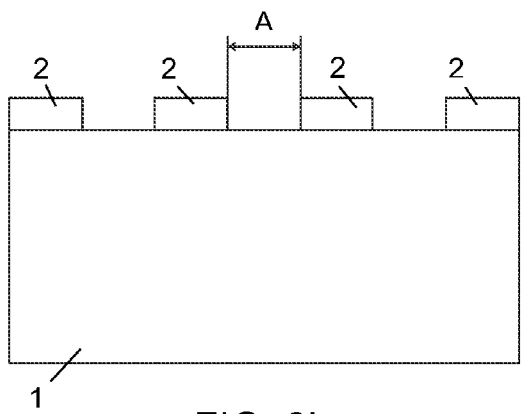

In the first step of the embodiment of FIGS. 2a to 2r, a first mask 2 is deposited on the wafer 1 to define desired areas on the wafer and to block the remaining areas as is illustrated by FIGS. 2a and 2b. After having deposited the first mask 2 on the wafer 1, the mask 2 is patterned. The patterning shows which parts of the wafer should be etched.

The wafer 1 has to be patterned and etched in order to define the structural features of a sensor in its semiconductor layer. Masking is needed for the etching so that the etching should affect only specific areas of the wafer and block regions where etching is not desired.

The masking can be performed by patterning a deposited masking material.

For patterning a deposited masking material, e.g. the known process of photolithography (also called optical lithography) can be used. Photolithography involves the use of a photoresist (PR) material as a mask material in order to generate the specific pattern on the surface of the wafer, i.e. to define the shape of micro-machined structures on the wafer 1.

As an alternative, a silicon dioxide ($SiO_2$) film can be used as a mask material.

Photoresist (PR) being a light-sensitive material can be processed into a specific pattern by being exposed to light energy in the shape of the desired pattern. The patterning of a photoresist takes place by exposing the material to ultraviolet (UV) light. Once the PR has been patterned, the wafer will be covered by the PR only in specific areas while the remainder of the wafer is uncovered. Photolithography is useful because it can transfer the pattern to the wafer surface very quickly. Direct-write methods (similar to those used to create the optical mask) can also be used but are slower.

In some cases, the chemical strength of the photoresist is not high enough to endure proper etching of the silicon wafer. In such cases an additional layer of more stable material (like silicon dioxide) is added between the photoresist and the wafer. This is called as hard mask.

The dimension A in the figures defines the areas to be etched not covered by the mask. The intention is to etch equal areas both in the center part of the wafer (as shown by FIG. 2a) and in parts at the wafer edge (as shown by FIG. 2b) in accordance with dimension A.

Figure 2C:
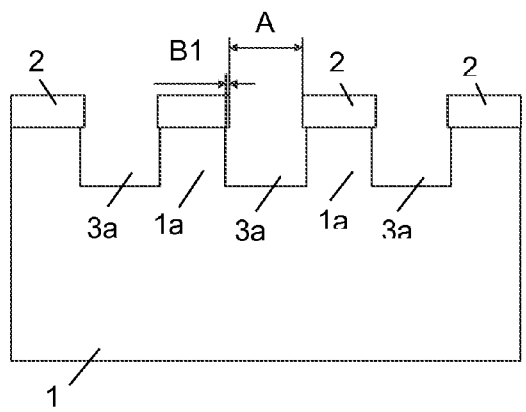
Figure 2D:
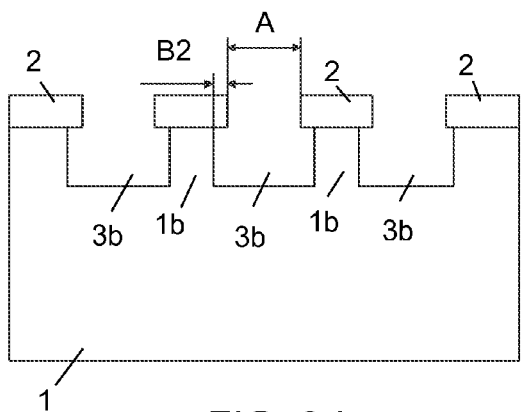

The parts not covered by the mask 2 are then etched in the second step of the method of the invention, as illustrated by FIGS. 2c and 2d, to form shallow first trenches 3a and 3b in an order of 0.5-5 μm, e.g. 2 μm. The etching removes material from the surface of the wafer 1.

The etching steps can be performed by e.g. plasma assisted dry etching, Reactive Ion Etching (RIE) or Deep Reactive Ion Etching, (DRIE). DRIE is a special subclass of RIE. It is a highly anisotropic etch process usually used to create deep penetration, steep-sided holes and trenches in wafers/substrates. RIE "deepness", however, depends on application. In MEMS, DRIE is typically used for anything from a few micrometers to 0.5 mm. In this process, etch depths of hundreds of micrometers are achieved with almost vertical sidewalls. An alternative process technology, where two different gas compositions alternate in the reactor, can be used.

FIGS. 2c and 2d show parts of a silicon wafer structure 1 that have been DRIE-etched on exposed surfaces not covered by a masking layer 2.

This shallow trench etching of step 2 results in a pattern of first trenches 3a and 3b and first structures 1a and 1b of the silicon wafer 1. Parts of the wafer have thus been etched away (in an extent defined by the trenches 3a and 3b) and the first structures 1a and 1b are parts of the silicon wafer 1. The trenches are usually not made deeper than 2 μm to avoid the final structure to be unnecessary low.

FIGS. 2c and 2d show such resulting non-uniformity as was described generally in FIGS. 1a and 1b. The DRIE etching causes a larger undercut B2 at the wafer edge than in the wafer center, wherein the undercut B1 is smaller. In the stage of FIGS. 2c and 2d, A is the dimension for the parts of the wafer not covered by the first mask. B1 and B2 are the distances of the undercut, which is the dimension of the portion that is etched away under the first mask 2. In reality the trenches under the mask 2 tend to have sloping sidewalls since the undercut is less immediately under the mask but is in FIGS. 2c and 2d simplified by presenting the trenches with straight sidewalls.

Figure 2E:
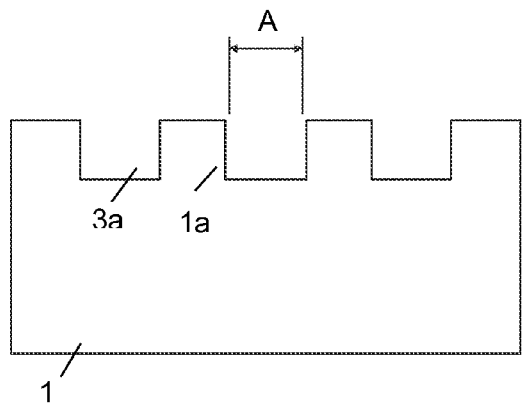
Figure 2F:
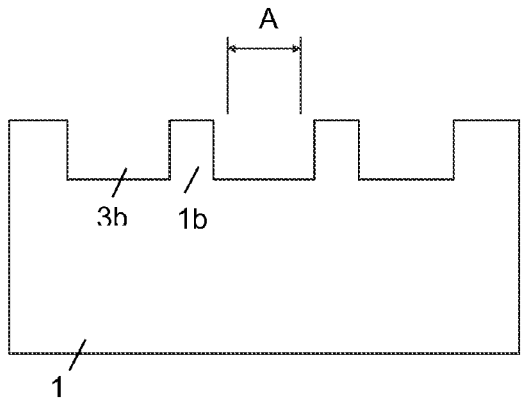

The distance of undercutting is called bias and its extent varies within the structure. Thus, the etching process causes a larger undercut bias B2 at the wafer edge as can be seen in FIG. 2d than in the wafer center as can be seen in FIG. 2c, wherein the undercut bias B1 is smaller. Therefore the trench dimension is broader at the wafer edge than the trench dimension at the center of the wafer and analogously, the structure dimension is smaller at the wafer edge than the structure dimension at the center of the wafer The process then continues with the third step of the method in mask stripping to remove the first mask 2 away from the substrate as shown in FIGS. 2e and 2f. If a photoresist was used for the mask, a liquid "resist stripper", is used, which chemically alters the mask so that it no longer adheres to the substrate. Alternatively, the photoresist mask may be removed by a plasma containing oxygen, which oxidizes it. This process is called plasma ashing, and resembles dry etching.

In the case of a $SiO_2$ mask, it is removed by hydrofluoride acid (HF) or alternatively, the $SiO_2$ mask is not removed in this stage yet but later.

Figure 2G:
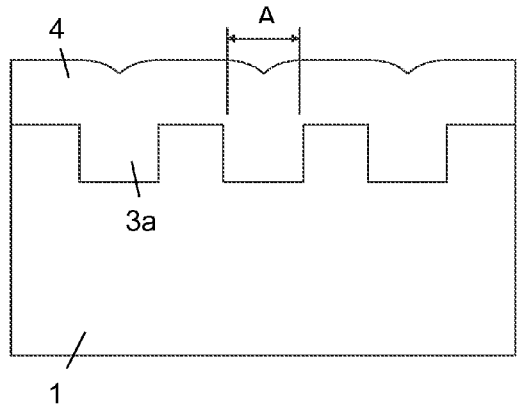
Figure 2H:
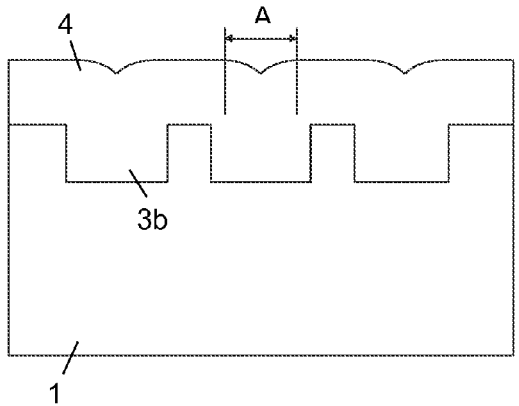

One or more masking materials, such as silicon dioxide, is then deposited in a fourth step shown by FIGS. 2g and 2h as a layer 4 to fill the trenches 3a and 3b by chemical vapor deposition (CVD). For CVD, silicon dioxide ($SiO_2$) is an ideal material because of its conformal deposition properties. In this step, the wafer (substrate) is exposed to one or more volatile precursors, which react and/or decompose on the substrate surface to produce the desired deposit of $SiO_2$.

Metal is also a possible masking material, and in that case, Physical Vapor Deposition, PVD, in practice sputtering in this invention, is used rather than CVD. Other possible methods for the deposition of the metal is electro-deposition or electroless deposition.

To get the silicon dioxide ($SiO_2$), e.g. Tetraethyl OrthoSilicate (TEOS) can preferably be used as a precursor since TEOS has a remarkable property to decompose into silicon dioxide. Tetraethyl orthosilicate is the chemical compound with the formula $Si(OC_2H_5)_4$.

Also a silane can be used as a precursor to silicon dioxide and can be applied to substrates under dry aprotic conditions by CVD, which favors monolayer deposition. Silanes are saturated hydrosilicons, with the general formula $SinH2n+2$. The simplest silane is an inorganic compound with chemical formula $SiH_4$. Silane may also refer to many compounds containing silicon, such as trichlorosilane ($SiHCl_3$) and tetramethylsilane ($Si(CH_3)_4$). Under proper conditions almost all silanes can be applied to substrates in the vapor phase.

Instead of CVD, Spin-On-Glass deposition can be used. Spin-on Glass (SOG) is an inter level thin film dielectric material used as insulation and as a planarization layer. It is spin-coated onto a silicon wafer to fill even submicron gaps in the pre-metal and metal levels while planarizing the surfaces. After drying and curing/sintering, the spin coated liquid film turns into a Si—O network thin film material with a performance similar to $SiO_2$.

Figure 2I:
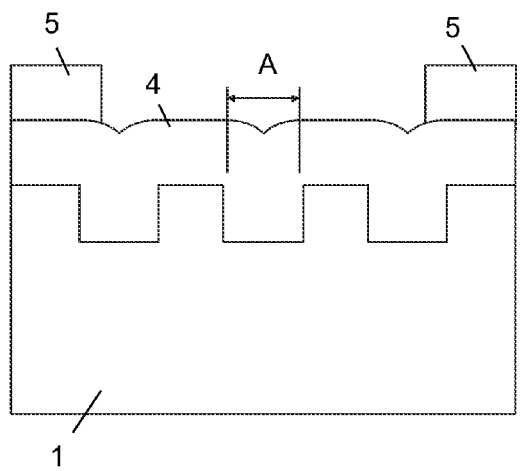
Figure 2J:
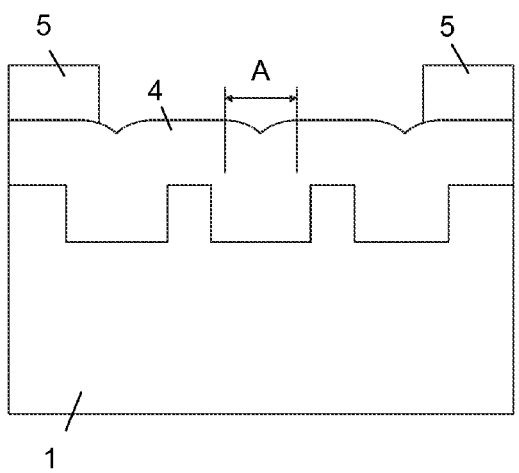

FIGS. 2*i* and 2*j* show the fifth step of the method of the invention, wherein a third mask 5 is deposited as an intermediate mask on the silicon dioxide trench filling 4 on selected areas. The third mask 5 protects those parts of the trench filling 4, where no etching should take place for defining the final structures.

Figure 2K:
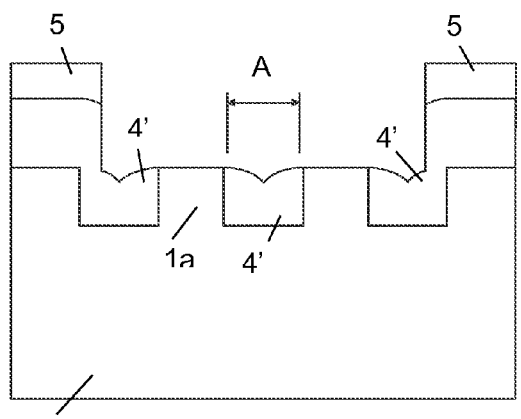
Figure 2L:
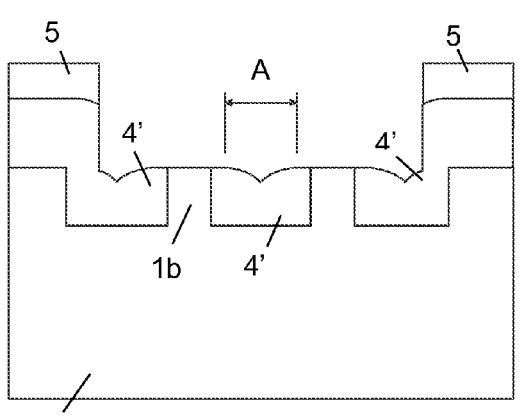

In the next and sixth step, as illustrated by FIGS. 2*k* and 2*l*, a part of the trench filling 4 of silicon dioxide presented in FIGS. 2*i* and 2*j* is removed approximately to the top surface of structures 1*a* and 1*b* to reveal the top surface on areas to be etched. The original trenches 3*a* and 3*b* are now filled with remaining silicon dioxide. It is left on desired second areas to function as a second mask (4') to define final structures as protected by the third mask 5. Some suitable technique such as chemical-mechanical planarization or lithography and etch back of the silicon dioxide can be used for the removing.

FIGS. 2*m* and 2*n* show a DRIE etch step for making the final structures as the seventh step of the method of the invention. The DRIE etching of the seventh step results in forming of second trenches 6 and second structures 1'.

As can be seen in FIGS. 2*m* and 2*n*, the width of the second mask parts 4' is in the original trenches now larger in areas wherein the DRIE etch causes a larger undercut, i.e. at or near the wafer edge (because the original trenches 3*b* at or near the wafer edge were larger than the original trenches 3*a* in the middle of the wafer). This mask over-dimension compensates the undercut to be formed during the DRIE etching and ideally, the final structures 1' (and the second trenches 6) become equally wide in corresponding areas.

The method of the invention can be considered as using inverted masking compared to prior art methods. The first mask 2 primarily protects areas of the wafer not to be etched and defines first structures not to be etched, but, in fact, the first mask 2, at the end, defines the final structures 1' indirectly in a way so that its dimensions become the width of the second trenches 6 that form the final structures.

FIGS. 2*o* and 2*p* shows the eighth step of the method which includes cleaning of the wafer by stripping the third mask 5 away separately or simultaneously with the second mask 4'.

FIGS. 2*q* and 2*r* shows the ninth step of the method which includes cleaning of the wafer by stripping the second mask 4' away by e.g. hydrofluoride acid (HF) if it was not removed already in connection with removing the third mask 5.

The inertial structures 1' are finished by cleaning and they remain lower than the rest of the surface of the wafer 1 in an extent corresponding to the first trench etch depth.

FIGS. 3*a* to 3*e* together with either FIG. 4*a* to 4*d* or 5*a* to 5*d* show generally an example of the invention for providing a complete Cavity-Silicon-On-Insulator (SOI) structure successively step by step by structuring a silicon wafer.

Figure 3A:
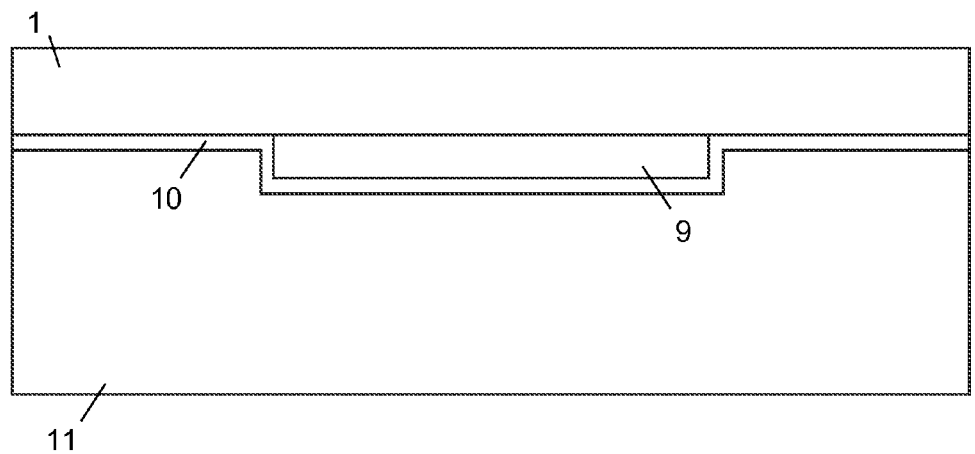
FIGS. 3a-3e shows generally the first part of the method of the invention for providing a complete Cavity-Silicon-On-Insulator (SOI) structure.

FIG. 3*a* shows a center part of a pre-etched SOI wafer 1 with an air cavity 9, which is a suitable platform for vertically and horizontally moving structures in various applications for MEMS devices, such as capacitive inertial sensors, gyroscopes and accelerometers. A silicon handle wafer 11 is thermally oxidized to form a silicon dioxide, $SiO_2$, layer 10.

The sealed cavity 9 of FIGS. 3 to 5 intended for MEMS applications was formed by bonding two silicon wafers 1, 11 together, the bottom or handle wafer 11 having pre-etched shallow cavities 9. (FIGS. 3 to 5 show only a part of the wafer having one cavity but there are several cavities in the whole wafer). After bonding, the device wafer or "active" wafer 1, is thinned down to form a suspended diaphragm over the cavity 9. The device wafer 1 is in FIGS. 3 to 5 a SOI wafer. The silicon oxide layer 10 acts as an etch stop after wafer bonding.

Figure 3B:
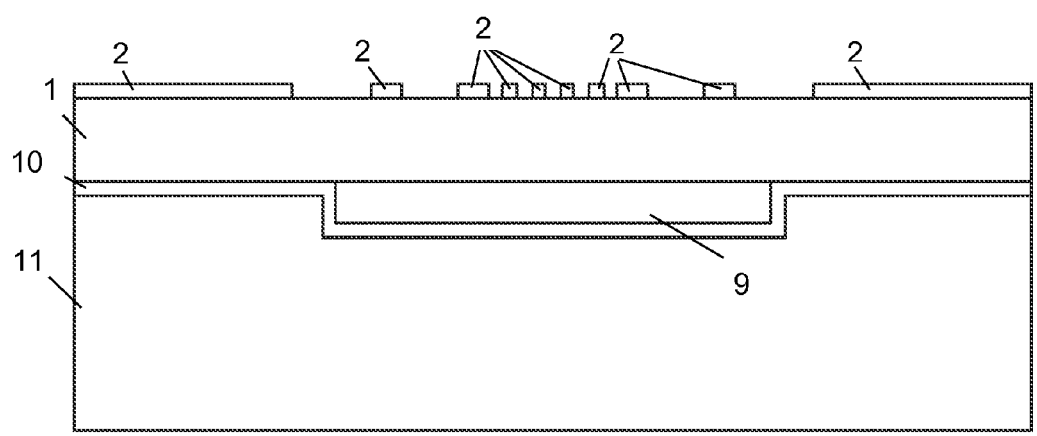

FIG. 3*b* (correspondingly to FIGS. 2*a* to 2*b*) shows the first step of an example of a method of the invention, in which a first mask 2 is deposited on the wafer 1 in a pattern to define the areas on the wafer 1 to be etched away and to block the remaining areas from being etched.

Figure 3C:
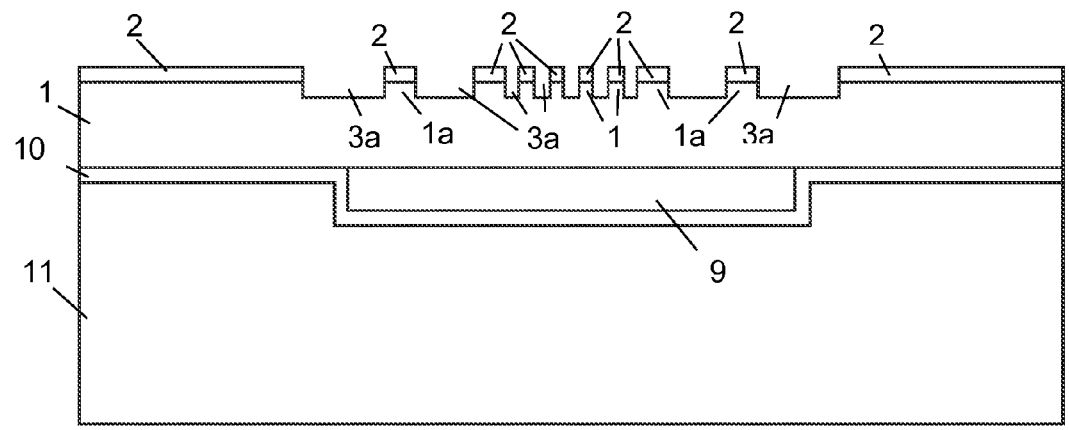

The parts not covered by the mask 2 are then etched in the second step of the method of the invention, as illustrated by FIG. 3*c* (correspondingly to FIGS. 2*c* to 2*d*), to form shallow first trenches 3*a* in an order of ca 2 μm.

As the intention in FIGS. 3*a* to 3*e* together with FIGS. 4*a* to 4*d* and 5*a* to 5*d* is only to generally illustrate an example of the invention for providing a complete Cavity-Silicon-On-Insulator (SOI) structure, the undercut problem, discussed in connection with FIGS. 1 and 2, is not handled here and only the trenches in the middle of the wafer is presented.

The etching removes material from the surface of the wafer 1. FIG. 3*c* shows a part of wafer that have been DRIE-etched on exposed surfaces not covered by a masking layer 2.

This shallow trench etching of step 2 results in first trenches 3*a* and first structures 1*a* of the silicon wafer 1. Parts of the wafer have thus been etched away and the first structures 1*a* are parts of the silicon wafer 1.

Figure 3D:
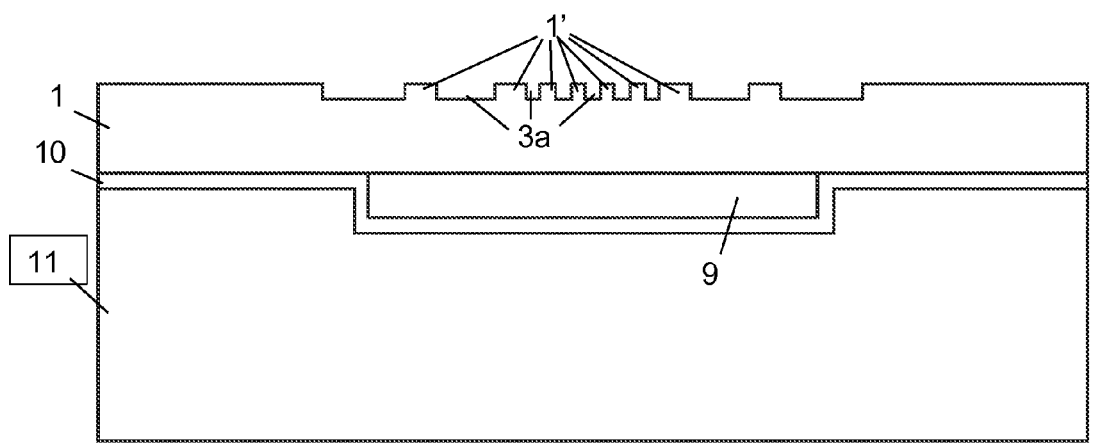

The process then continues with the third step of the method in mask stripping to remove the first mask 2 away from the substrate as shown in FIG. 3*d* (correspondingly to FIGS. 2*e* and 2*f*).

Figure 3E:
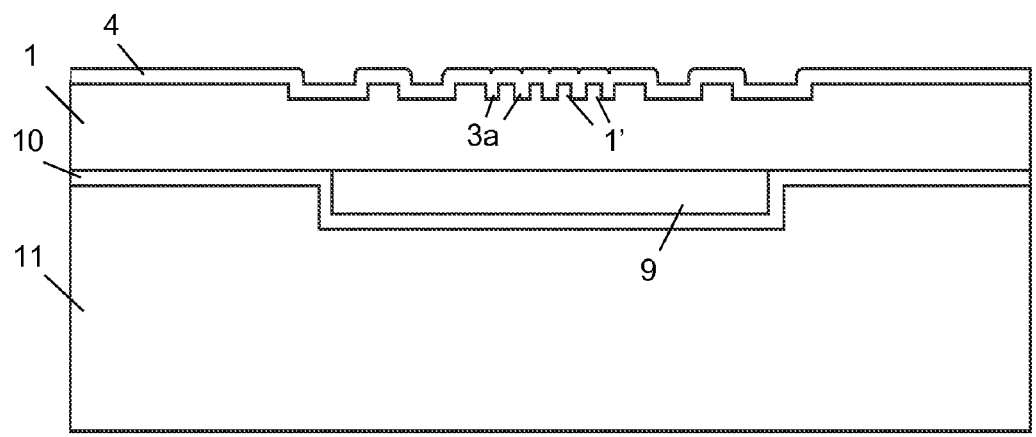

One or more masking materials, such as silicon dioxide, is then deposited in a fourth step shown by FIG. 3*e* (correspondingly to FIGS. 2*g* and 2*h*) as a layer 4 to fill the trenches 3*a* by chemical vapor deposition.

For the next steps until the final structure, two different embodiment alternatives are presented in FIGS. 4*a*-4*d* and FIGS. 5*a*-5*d*, respectively.

The first embodiment alternative, presented by FIGS. 4*a*-4*d*, is an etch-back procedure, wherein a part of the masking material deposited as a trench filling 4 is chemically removed to reveal top surface of the inertial structures 1'.

Figure 4A:
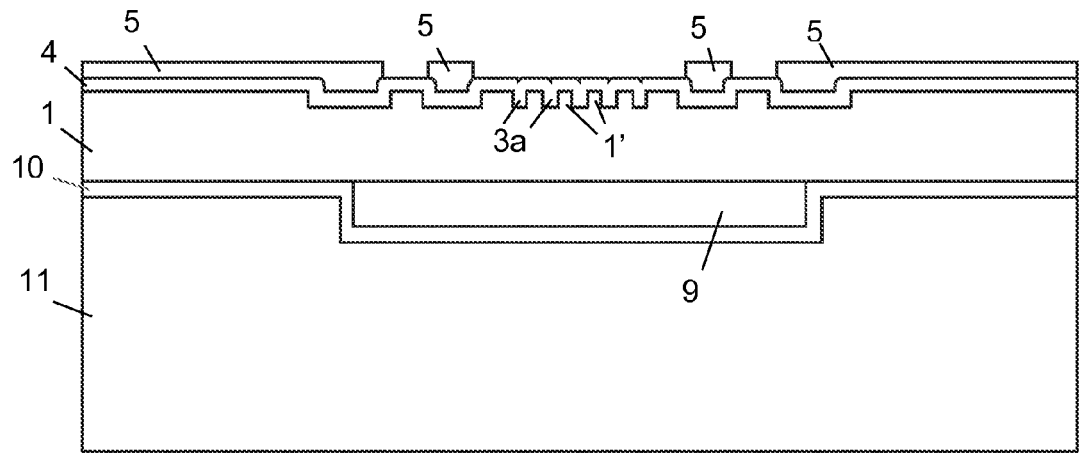
FIGS. 4a-4d shows a first embodiment of the second part of the method of the invention for providing a complete Cavity-SOI structure.

In the first embodiment, FIG. 4a (correspondingly to FIGS. 2i and 2j) shows the fifth step of the method of the invention, wherein a third mask 5 is deposited on the silicon dioxide trench filling 4 on selected areas where etching is not allowed.

Figure 4B:
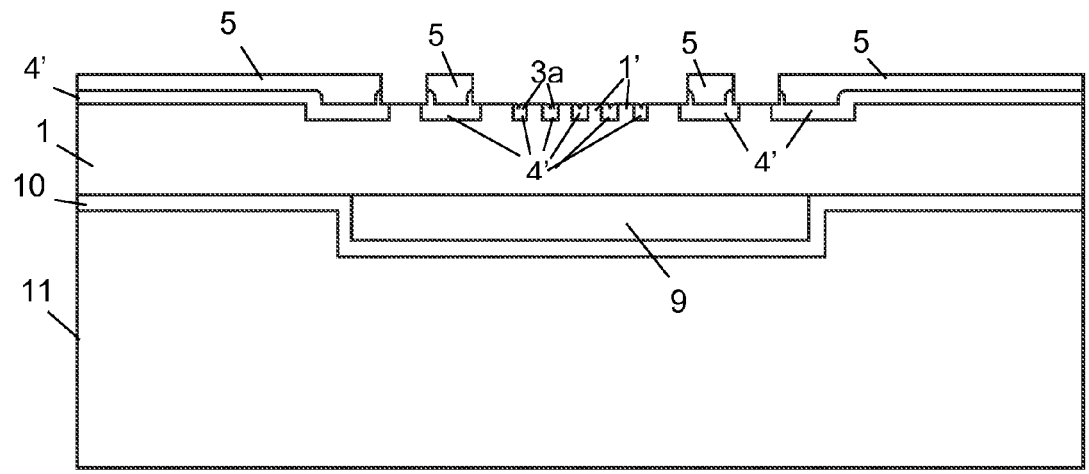

In the next and sixth step, as illustrated by FIG. 4b (correspondingly to FIGS. 2k and 2l), a part of the masking material filling 4 is removed using some suitable technique such as lithography and etch back. The third mask 5 protects the masking material filling 4 on areas defining the final structure and where final structure etching is not allowed.

Figure 4C:
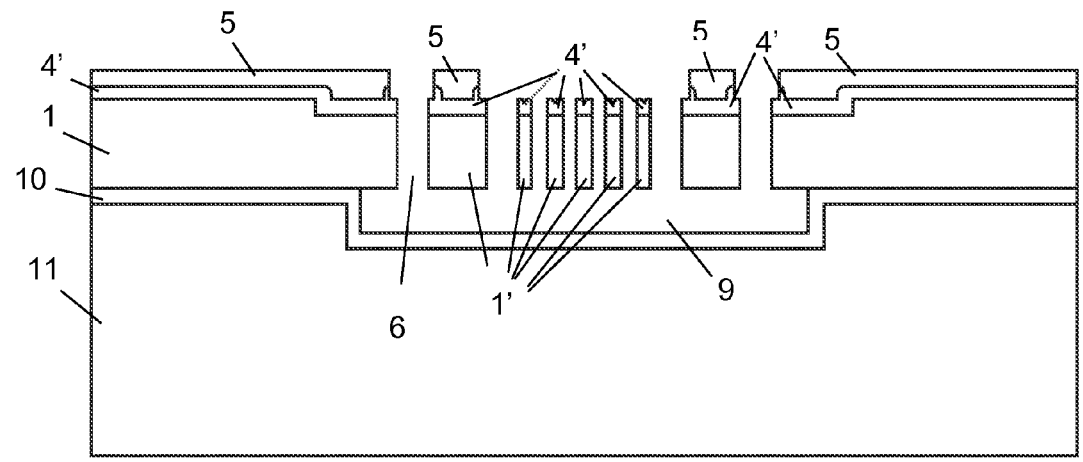

FIG. 4c (correspondingly to FIGS. 2m and 2n) shows a DRIE etch step for making the final structures as the seventh step of an example of a method of the invention. The remaining filling 4' act as a second and final structure mask and the DRIE etching of the seventh step results in forming of second trenches 6 and second inertial structures 1'.

Figure 4D:
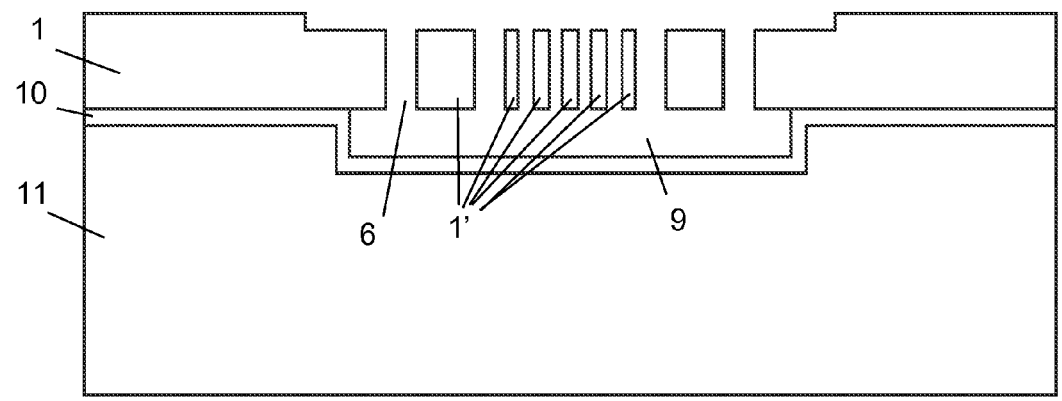

FIG. 4d, correspondingly to FIGS. 2o to 2r, shows the result of the eighth and ninth steps of the method which include cleaning of the wafer by stripping the third and intermediate mask 5 and the remaining filling 4', which worked as a second and final structure mask 4', away. The inertial structures 1' are finished and they remain lower than the resting surface of the wafer 1 in an extent corresponding to the first trench etch depth.

Figure 5A:
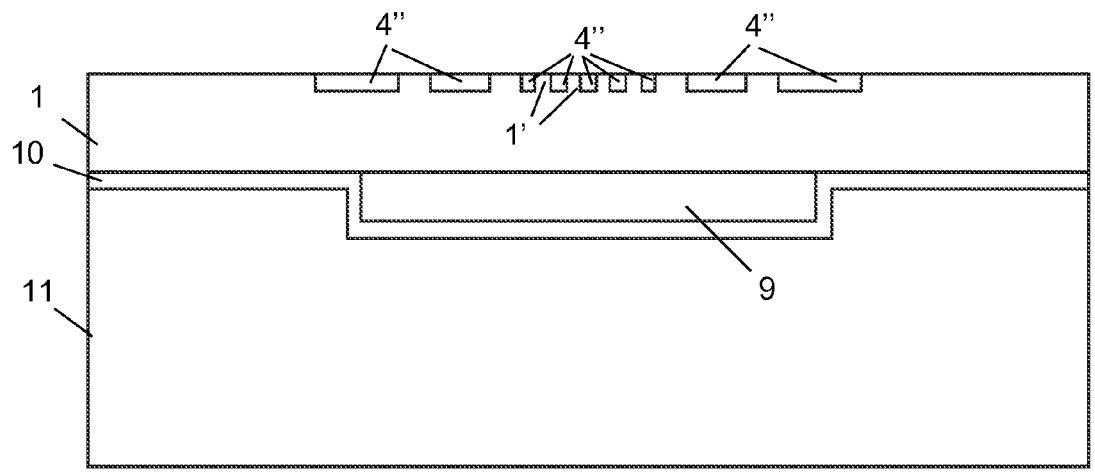
FIGS. 5a-5d shows a second embodiment of the second part of the method of the invention for providing a complete Cavity-SOI structure.

An alternative fifth step presented by FIG. 5a follows the fourth step shown by FIG. 3e, in which one or more dielectric materials, such as silicon dioxide, was deposited as a layer 4 to fill the trenches 3a.

In the second embodiment alternative, presented by FIGS. 5a-5d, Chemical Mechanical Polishing/Planarization (CMP) is used to smooth the surface of the wafer and remove filling 4 on areas to be etched. The remaining filling 4' left on areas other than the areas to be etched fills the trenches 3a as shown by FIG. 5a. Chemical Mechanical Polishing/Planarization is a process of smoothing surfaces with the combination of chemical and mechanical forces. It can be thought of as a hybrid of chemical etching and free abrasive polishing. The fifth step presented by FIG. 5a uses the above mentioned CMP process to smooth the surface of the wafer, whereby a part of the silicon dioxide layer 4 is left deposited on the wafer as a remaining filling 4' in the shape of trenches 3a.

Figure 5B:
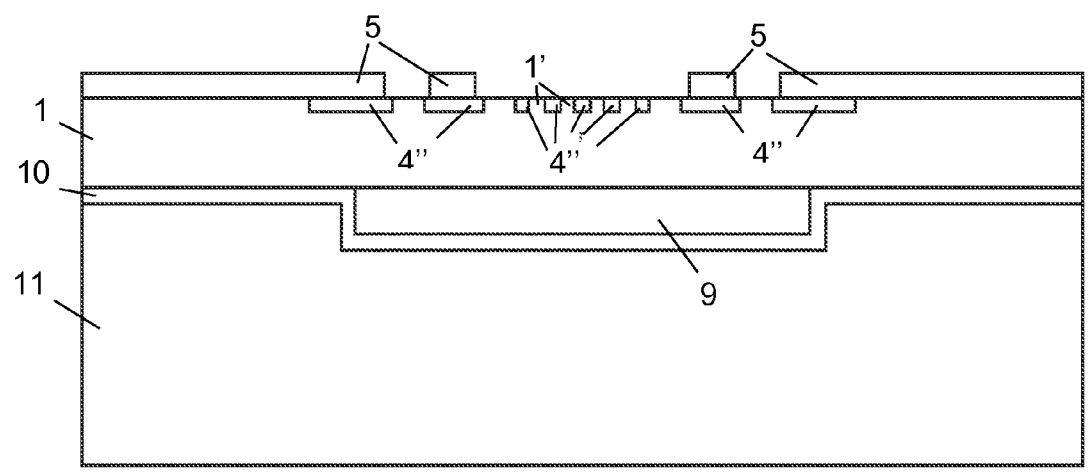

Not until thereafter, in the sixth step of the second embodiment of the example of the invention as presented by FIG. 5b, a third mask 5 is deposited as an intermediate mask for defining the final structure in order to protect areas where etching for finals structures is not allowed.

Figure 5C:
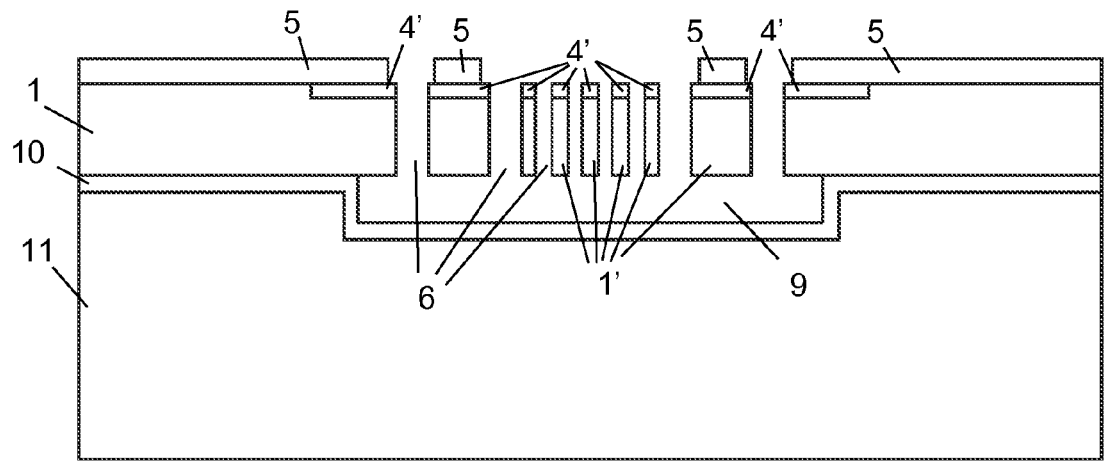
Figure 5D:
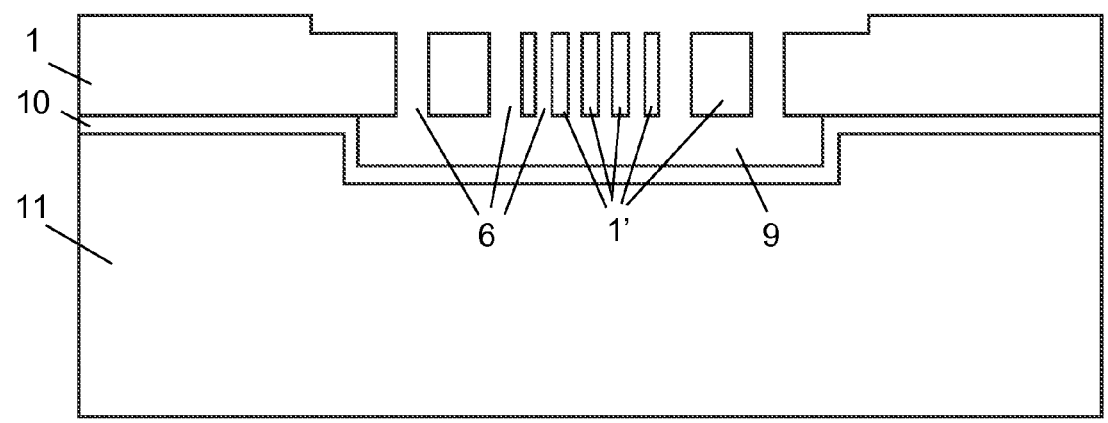

The steps of FIG. 5c-5d correspond to FIGS. 4c-4d.

Thus, FIG. 5c shows a DRIE etch step for making the final structures. The remaining filling 4' act as a second and final structure mask and the DRIE etching results in forming of second trenches 6 and second structures 1'.

FIG. 5d includes cleaning the wafer by stripping the third mask 5 and the remaining filling, which worked as a second mask 4', away. The inertial structures 1' are finished and they remain lower than the resting surface of the wafer 1 in an extent corresponding to the first trench etch depth.

Embodiments of the invention result in structures that are lower than the surface, which is not a problem but rather a benefit since space for structure motion is needed anyway. The method may not provide a very accurate gap depth control but this is not an issue for z-axis gyroscopes, which do not measure anything in a vertical direction. Therefore the proposed process is very suitable especially for z-axis gyroscopes but can equally well be used for e.g. accelerometers.

FIGS. 6a to 6l present a third embodiment of the method of the invention for providing a complete Cavity-Silicon-On-Insulator (SOI) structure successively step by step by structuring a silicon wafer, including recessed structures. This third embodiment of the invention enables creation of two different depths of shallow trenches in order to make recessed inertial structures and/or recessed areas in within the inertial structures. Term recessed structure refers to a part of the inertial structure where an upper edge of the silicon forming the recessed inertial structure is recessed below the horizontal top face of the other parts of the inertial structure which may be different than the original top face of the silicon wafer 1. In FIGS. 6a to 6l we can see, in addition to the device wafer that is processed, also the so called handle wafer 11, and a protective silicon dioxide layer 10, also called as buried oxide layer, that functions as a bonding interface and sacrificial layer between the device and handle wafers as well as protects the handle wafer 11 during the subsequent silicon etching step.

For purpose of creating recession for the recessed structures, additional steps are performed before a DRIE etch step for making the final structures as the seventh step of the method of the invention described in connection with FIGS. 2n-2m (corresponding to the tenth step of the third embodiment).

Figure 6A:
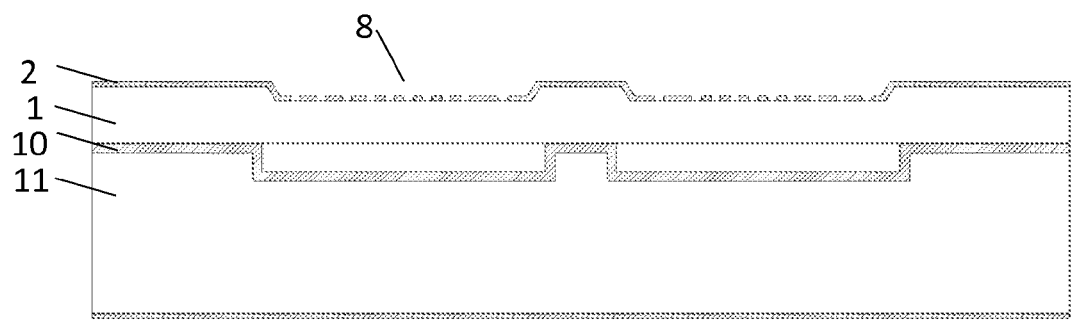
FIGS. 6a-6l shows a third embodiment of the method for providing a complete Cavity-SOI structure including recessed structures.

FIG. 6a of the third embodiment corresponds to FIGS. 2a-2b. A first mask 2 is deposited on the wafer 1 to define desired areas on the wafer and to block the remaining areas. The first mask 2 may comprise a silicon dioxide SiO2 layer patterned by photolithography. In this example, the inertial parts of the MEMS device are created in an area of a shallow basin 8. These shallow basins 8 have been created to the device wafer before the processing steps for creating the inertial structures begins. Purpose of such basins 8 is to create vertical space above the inertial parts in the final structure, allowing the inertial parts the required room for movement in vertical dimension. While these basins 8 are relatively shallow and have a large area as compared to the inertial parts to be created and/or the line width of the masks used in the following process, these areas may be considered as flat surface in view of patterning for example the a first mask. Forming such basins 8 in the device wafer is not necessary, but the needed room for movement may for example be implemented instead in the cap structure that is later placed on top of the device wafer. With top face of the device wafer we refer either to the actual top face of the wafer or the top face of the basins 8, whichever is applicable.

Figure 6B:
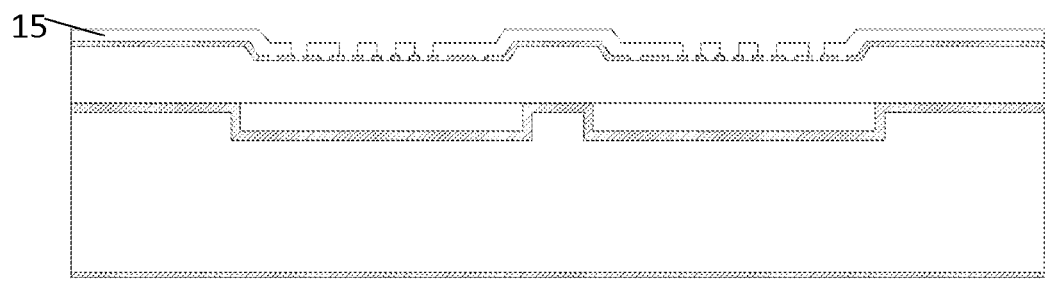

FIG. 6b shows a second step in the process according to the third embodiment. In order to define the recessed areas, a first intermediate mask 15 is deposited on top of the first mask 2 on selected areas. This intermediate mask 15 may comprise a photoresist layer patterned with photolithography. The first intermediate mask 15, together with the first mask 2, leaves visible those part of the silicon wafer 1 that will be etched to a first intermediate recession depth in a recession etching, whereas it protects those parts of the silicon wafer 1 that are not protected by the first mask 2, but will be later etched to form the outlines of the final structures in the first trench etching step. The first intermediate mask 15 also covers at least partially the first mask 2. It can also be noticed that while the first mask 2 actually defines outlines of the final structures, the first intermediate mask 15 has somewhat released requirements for lateral alignment without having effect on the accuracy of the lateral alignment of the final structures. The accuracy of alignment of the first intermediate mask 15 is defined by the minimum width of the patterns covered by the first mask 2. In addition to creating fully recessed structures, the first intermediate mask may also define recessed grooves within larger structures such as inertial masses (e.g. proof masses). As known by a person skilled in the art, such recessed grooves may be used for instance for reducing unwanted quadrature movement of the inertial masses.

Figure 6C:
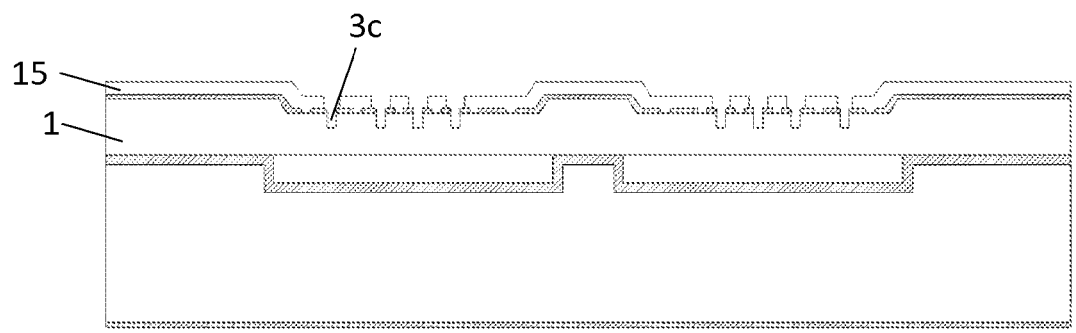

In FIG. 6c presenting a third step of the third embodiment, we can see a result of a recession etching step. This recession etching step of this embodiment forms recession trenches 3c in areas of the silicon wafer 1 having a first intermediate recession depth, which will eventually be etched to a first depth of recession. The depth of etching during the recession etching step is however slightly less deep than the intended first depth of recession.

Figure 6D:
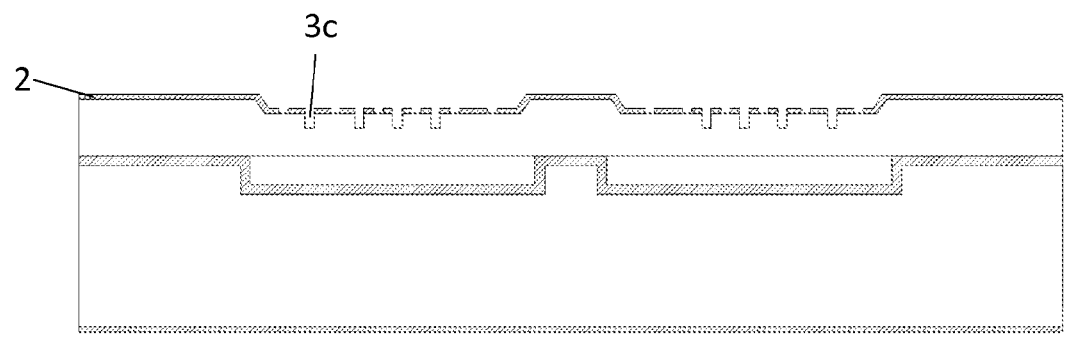

FIG. 6d represents a fourth step of the third embodiment, showing the situation after the first intermediate mask 15 has been stripped away. Stripping of the first intermediate mask 15 should occur separately from the first mask 2, since the first mask will be used for etching. For the purpose of stripping, the material of the first intermediate mask 15 is preferably different from material of the first mask 2, so that a suitable, selective stripping method may be used for the first intermediate mask 15 that does not have significant effect on the first mask 2. The first mask 2 may comprise for example a patterned layer of thermal SiO2.

Figure 6E:
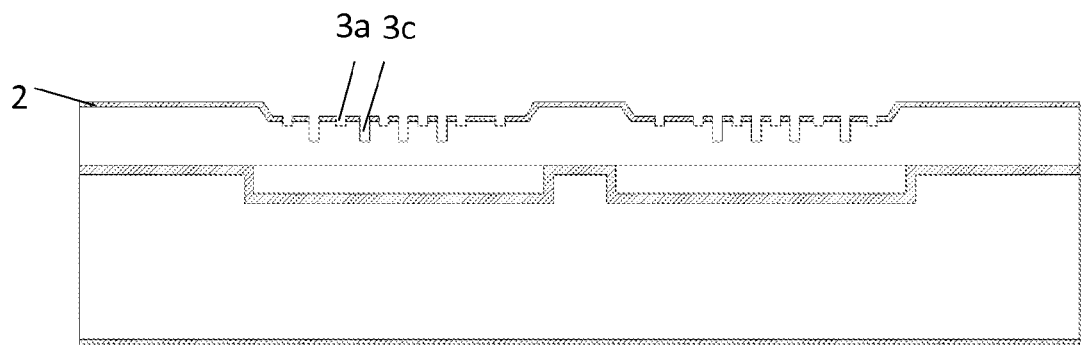

FIG. 6e presents a fifth step of the third embodiment, which similar to the first trench etching step corresponding to the earlier presented embodiment. Now, the originally placed first mask 2 is used for etching shallow first trenches 3a in the silicon wafer 1. Together the recession trenches 3c and the shallow first trenches 3a define the outlines of the final structures. Some of the recession trenches 3c may even exist within area of a larger mass and thus not defining outlines of the structures. This first etching step corresponds to FIGS. 2c-2d, except that the etching does not start from the top face of the silicon wafer 1 in all areas, but the recession trenches 3c will be further etched in vertical dimension simultaneously with etching the first shallow trenches 3a so that the depth of the recession trenches 3c is further increased. As a result of the first etching step, the recession trenches 3c, defining the recession depth of the recessed areas now have a depth corresponding to the intended first depth of recession, and the first shallow trenches 3a define the remaining outlines of structures. Together, the recession trenches 3c and the first shallow trenches 3d define all outlines of structures to be generated in the device wafer and all areas that will be recessed.

Figure 6F:
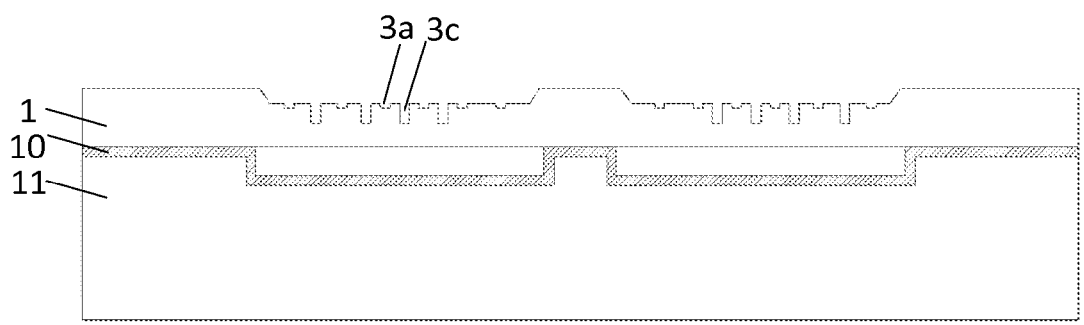

FIG. 6f presents a sixth step of the third embodiment. After the recession trenches 3c and the first trenches 3a have been created as planned in steps 6b, 6c, 6d and 6e, the first mask 2 is removed, so that the top face of the silicon wafer 1 with the recession trenches 3c and the shallow first trenches 3a is visible throughout the device area. This step corresponds to steps of FIGS. 2e-2f.

Figure 6G:
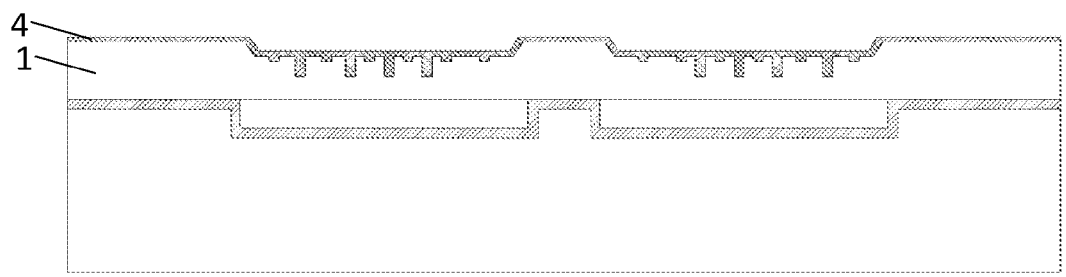

FIG. 6g presents a seventh step of the third embodiment. A layer of masking material, such as Tetraethyl Orthosilicate (TEOS) is deposited as a layer 4 to fill the recession trenches 3c and the shallow first trenches 3a. This masking layer 4 is preferably deposited by chemical vapor deposition. This step corresponds to FIGS. 2g-2h.

Figure 6H:
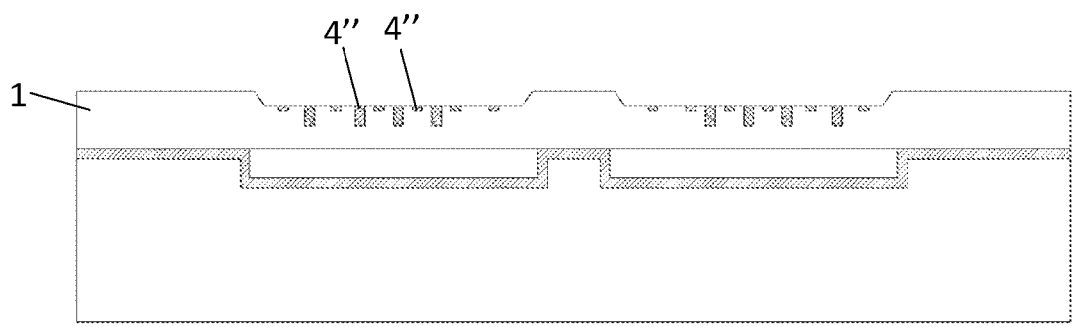

FIG. 6h presents an eighth step of the third embodiment. Now the portion of masking material 4 that covers the horizontal surface of the silicon wafer 1 is removed. The remaining filling 4' in the recession trenches 3c and the first trenches 3a remains essentially intact, forming a pattern corresponding to the recession trenches 3c and the first trenches 3a. This remaining filling 4" a.k.a. the second mask 4"corresponds to the second mask 4' of FIG. 5a, with a difference that now the second mask 4" defines structures that have been recessed to more than one recession depth with respect to each other, and/or larger structures that have areas with varying recession depths.

Figure 6I:
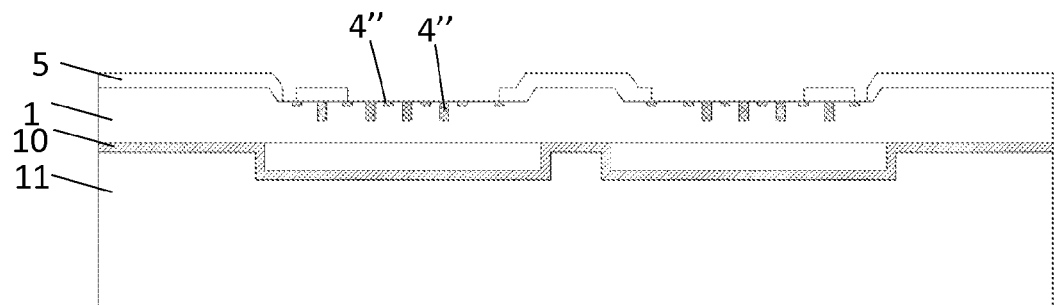

In a ninth step of the third embodiment, presented in FIG. 6i, a third mask 5 is deposited on the silicon wafer 1. This step corresponds to FIG. 5b. The third mask 5 may be deposited for example by patterning a layer of photoresist material with photolithography. The accuracy of alignment of the third mask 5 is defined by the minimum width of the patterns protected by the remaining filling forming the second mask 4'. It can also be noticed that the third mask 5 is now deposited to an essentially planar face of the silicon wafer 1: no trenches are visible on the top face of the silicon wafer 1, since all trenches have been filled with the filling material, forming the second mask 4'. This enables use of precise patterning methods if compared to patterning made on a face of a silicon wafer 1 that had different depths of grooves all over the area.

Figure 6J:
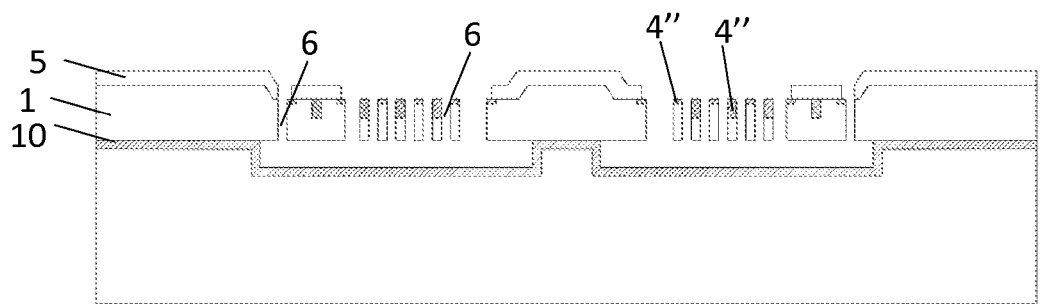

In a tenth step of the third embodiment, presented in FIG. 6j, a deep second etching is performed using the third mask 5, generating the second trenches 6. This steps corresponds to FIG. 5c. In this embodiment, the depth of the second trenches 6 is equal to the thickness of the device wafer 1, so that the device wafer material is removed in the area of the second trenches 6.

In a further third embodiment, steps corresponding to FIGS. 6f to 6j may be replaced with steps corresponding to FIGS. 2i-2n, where the third mask 5 is placed on top of the deposited silicon dioxide layer 4 in order to pattern the silicon dioxide layer 4. This second trench etching now removes silicon wafer in selected gaps between areas covered by the second mask 4" formed by the filled gaps.

Figure 6K:
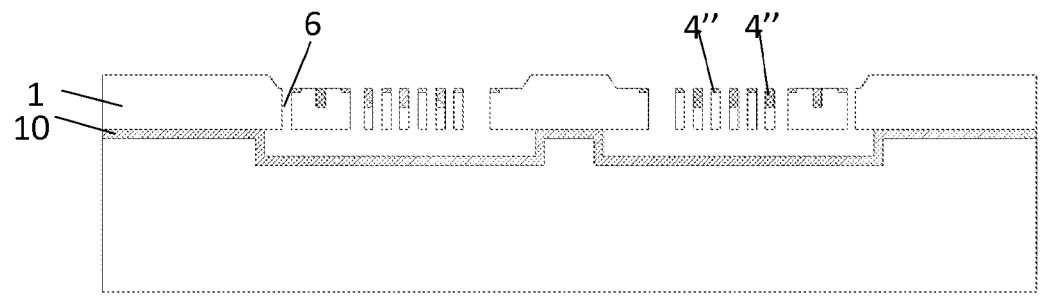
Figure 6L:
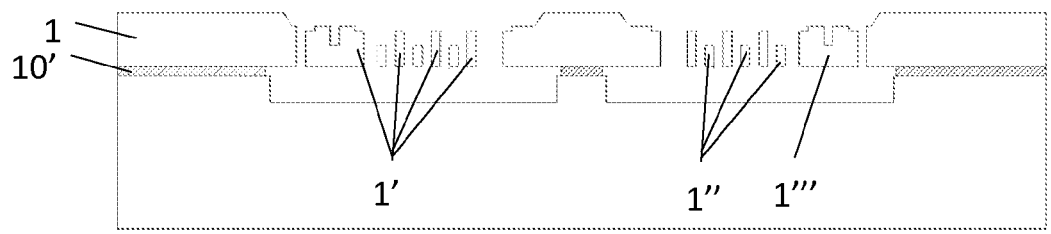

In an eleventh step of the third embodiment, presented in FIG. 6k, first mask 5' is stripped. This corresponds to FIGS. 2o-2p.

In a twelfth step of the third embodiment, the second mask 4" is finally stripped from the recession trenches 3c and the first trenches 3a together with stripping the silicon dioxide layer 10. This stripping sets the inertial structures 1', 1" and 1'" free. This final silicon dioxide stripping may be implemented by hydrofluoride (HF) acid vapor process or by wet HF process. Such wet or vapor stripping process effectively removes any exposed silicon dioxide $SiO_2$ even from structures within cavities. The device wafer 1 now forms structures 1', 1" and 1'" that are recessed below the top face of the device wafer 1 by different amounts. Structures 1' present large structures such as drive and/or proof masses which are by large extent not recessed below the top face of the device wafer 1. Such large structures may include recessed trenches as in this example. In addition, a characteristic shallow recession remains on the outlines of the large structures, created by the first shallow trenches 3a defining the outlines of the large structures 1'". Structures 1' are recessed slightly below the top face of the device wafer 1 similarly as was shown in the earlier embodiments. The recession of structures 1' is defined by the depth of the shallow trenches 3a. Structures 1" are recessed all the way to the first depth of recession, defined by the depth of the recessed trenches 3c.

We can see now that the final MEMS device structure includes parts 1', 1" and 1'" that are recessed to different depths relative to each other and below the top surface of the silicon wafer 1. A process capable of generating structures having variable, controllable amounts of recession enable for example creation of high performance comb structures, and thinner and thus more flexible spring structures, that have precisely defined amount of recession below the top face of the silicon wafer and thus precise thickness. While the lateral dimensions and the mutual lateral alignment of the differently recessed structures is defined by the first mask 2 that is created on a planar surface of the silicon wafer, the lateral alignment of all created structures is very precise. This improves the performance of the MEMS device.

The method of the invention results in a complete compensation only in an ideal and simplified case, wherein the etch profile in silicon is assumed to have straight side walls. In reality, there are also other kinds of non-realities that make the side wall profile to differ from straight. Therefore, the idea may bring only partial compensation in practice. However, since the non-ideality of the quadrature signal is biggest in a z-axis gyroscope, any improvement that reduces the effect is beneficial. The etch process can also be tuned to have more vertical side walls to increase the effect of the compensation. The effect of the compensation can also be increased by making the depth of the first trench etching deeper. This idea also helps in the etch process optimization by releasing the requirement for minimal undercut. This makes the process more robust for defects because allowing some undercut reduces process sensitivity against micro-masking caused by particle defects.

The invention claimed is:

1. A method of creating MEMS structures by selectively etching a silicon wafer that is patterned by using masking layers for defining the structural features of a MEMS device, the method comprising:
   a) depositing and patterning a first mask on a silicon wafer in order to define desired first areas on the wafer to be etched in a first trench etching and to define desired second areas to be etched in a second trench etching;
   b) depositing and patterning a first intermediate mask on top of the first mask, the first intermediate mask defining desired areas on the wafer to be recessed by etching to a first defined depth;
   c) etching recession trenches on the parts of the wafer not covered by the first intermediate mask nor the first mask in a recession trench etching;
   d) removing said first intermediate mask;
   e) etching first trenches and further etching the recession trenches on the parts of the wafer not covered by the first mask in a first trench etching;
   f) filling the first trenches and the recession trenches with a deposit layer;
   g) removing a part of the deposit layer on the desired second areas to be etched in the second trench etching and leaving a remainder on areas other than the second areas to function as a second mask in order to define final structures;
   h) etching parts of the wafer on the desired second areas in the second trench etching; and
   i) removing said second mask.

2. The method of claim 1, further comprising removing the first mask after step e).

3. The method of claim 1, further comprising removing the first mask together with a part of the second mask in connection with step g).

4. The method of claim 1, further comprising depositing a third mask after step f) to protect the deposit layer on areas defining the final structures, and removing the third mask together with the second mask in step i).

5. The method according to claim 1, further comprising depositing a third mask after step g) to protect the deposit layer on areas defining the final structure and removing the third mask together with the second mask in step i).

6. The method according to claim 1, wherein a photoresist is used as at least the first, second, or third mask, or as the first intermediate mask material, and wherein photolithography is used as a mask patterning method.

7. The method according to claim 1, wherein silicon dioxide or metal is used as the first, second, or third mask, or as the first intermediate mask material.

8. The method according to claim 1, wherein an anisotropic etching process is used as the etching method in steps b) or e).

9. The method according to claim 8, wherein the anisotropic etching process comprises Deep Reactive Ion Etching (DRIE).

10. The method according to claim 1, wherein the recession trench etching results in recession trenches having a depth of 0.5-5 µm.

11. The method according to claim 1, wherein the first trench etching results in shallow first trenches having a depth of 0.4-5 µm.

12. The method according to claim 1, wherein the second trench etching results in second trenches having a depth of 2-100 µm, and wherein said second trenches extend through the device wafer.

13. The method according to claim 1, wherein said method comprises removing the first, second, or third mask, or first intermediate mask, by a liquid resist stripper or plasma ashing.

14. The method according to claim 1, wherein a dielectric material or a metal is used as the deposit material layer.

15. A method according to claim 14, wherein said dielectric material comprises Tetraethyl Orthosilicate (TEOS).

16. The method according to claim 1, wherein chemical vapor deposition, CVD, is used for depositing the deposit layer.

17. The method according to claim 1, metal is used as the deposit material layer, whereby Physical Vapor Deposition, PVD, electro-deposition, or electroless deposition, is used for depositing the deposit layer.

18. The method according to claim 1, said method further comprising removing the part of the deposit layer in step g) chemically by an etch-back procedure.

19. The method according to claim 1, said method further comprising removing the part of the deposit layer in step g) by Chemical-Mechanical Planarization, CMP.

20. A method for manufacturing a gyroscope, said method comprising the method of claim 1, with structures of the method being dimensioned in a manner which is suitable for a gyroscope.

21. A method for manufacturing an accelerometer using the method of claim 1, wherein structures of the method are dimensioned suitable for an accelerometer.

* * * * *